(12) United States Patent  
Klee et al.

(10) Patent No.: US 7,345,404 B2
(45) Date of Patent: Mar. 18, 2008

(54) ELECTRONIC DEVICE

(75) Inventors: Mareike Katharine Klee, Hueckelhoven (DE); Theodoor Gertrudis Silvester Maria Rijks, Eindhoven (NL); Pieter Lok, Nijmegen (NL); Ruediger Guenter Mauczok, Erkelenz (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/584,042

(22) PCT Filed: Dec. 20, 2004

(86) PCT No.: PCT/IB2004/052868

§ 371 (c)(1),
(2), (4) Date: Jun. 21, 2006

(87) PCT Pub. No.: WO2005/064701

PCT Pub. Date: Jul. 14, 2005

(65) Prior Publication Data

US 2007/0108875 A1 May 17, 2007

(30) Foreign Application Priority Data

Dec. 22, 2003 (EP) .................. 03104892

(51) Int. Cl.
*H01L 41/08* (2006.01)
*H01L 41/047* (2006.01)
(52) U.S. Cl. .............. 310/330; 310/349; 310/365
(58) Field of Classification Search .......... 310/348, 310/352, 353, 328, 330, 365, 349
See application file for complete search history.

(56) References Cited

U.S. PATENT DOCUMENTS

| 3,646,413 | A  | * | 2/1972  | Oomen ..................... 361/281 |
| 4,675,960 | A  | * | 6/1987  | Higgins, Jr. ................ 29/25.35 |
| 4,759,823 | A  |   | 7/1988  | Asselanis et al. |
| 5,880,553 | A  | * | 3/1999  | Okeshi et al. ............. 310/352 |
| 7,122,942 | B2 | * | 10/2006 | Song et al. ................ 310/328 |
| 2002/0109436 | A1 | * | 8/2002 | Peng et al. ................ 310/328 |
| 2004/0075366 | A1 | * | 4/2004 | Mehta ....................... 310/336 |
| 2005/0151444 | A1 | * | 7/2005 | Mehta ..................... 310/313 B |
| 2005/0194867 | A1 | * | 9/2005 | Kawakubo et al. ......... 310/348 |
| 2005/0236935 | A1 | * | 10/2005 | Ohmori et al. ............. 310/328 |
| 2006/0227489 | A1 | * | 10/2006 | Bunyan et al. ............. 361/160 |

FOREIGN PATENT DOCUMENTS

| FR | 2864951 | * | 7/2005 |
| GB | 2 353 410 |   | 2/2001 |
| WO | WO 2005/064701 |   | 7/2005 |

* cited by examiner

*Primary Examiner*—Thomas M. Dougherty

(57) ABSTRACT

The microelectromechanical system (MEMS) element (101) comprises a first electrode (31) that is present on a surface of substrate (30) and a movable element (40). This overlies at least partially the first electrode (31) and comprises a piezoelectric actuator, which movable element (40) is movable towards and from the substrate (30) by application of an actuation voltage between a first and a second position, in which first position it is separated from the substrate (30) by a gap. Herein the piezoelectric actuator comprises a piezoelectric layer (25) that is on opposite surfaces provided with a second and a third electrode (21,22) respectively, said second electrode (21) facing the substrate (30) and said third electrode (22) forming an input electrode of the MEMS element (101), so that a current path through the MEMS element (101) comprises the piezoelectric layer (25) and the tunable gap.

9 Claims, 1 Drawing Sheet

ELECTRONIC DEVICE

Figure 1:
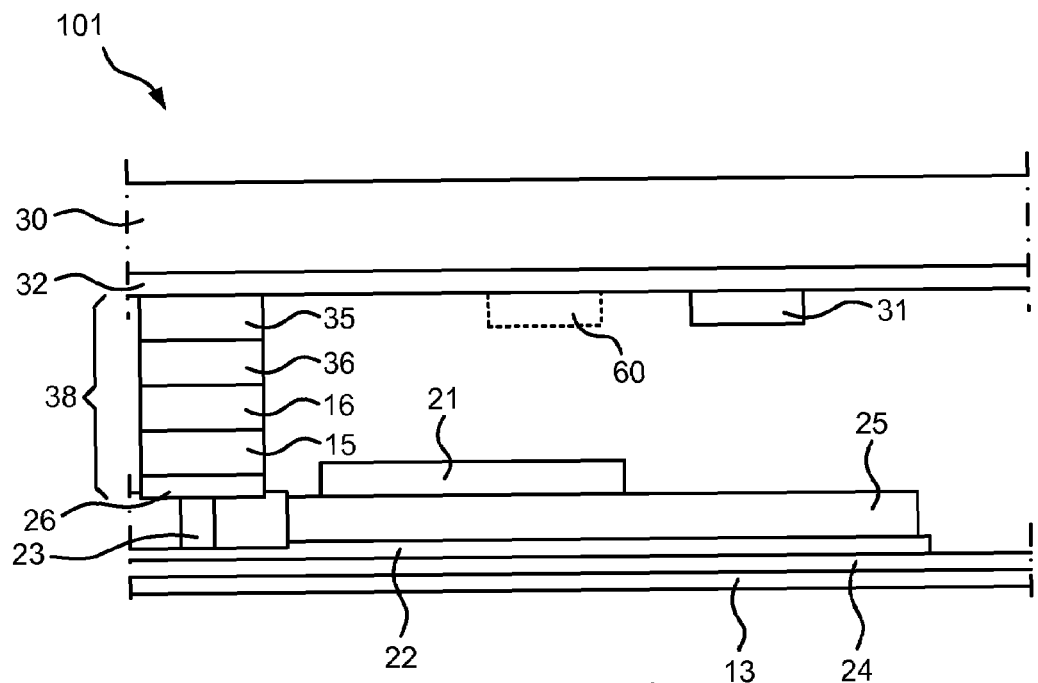

The invention relates to an electronic device provided with a microelectromechanical system (MEMS) element that comprises a first electrode that is present on a substrate and a movable element that overlies at least partially the first electrode and comprises a piezoelectric actuator, which movable element is movable towards and/or from the substrate between a first and a second position by application of an actuation voltage to the piezoelectric actuator, in which first position it is separated from the substrate by a gap.

Such an electronic device is for instance known from GB-A 2,353,410. The known electronic device comprises a movable element such as a beam or a membrane that is provided with a piezoelectric actuator. This actuator comprises a layer of piezoelectric material between actuation electrodes. The movable element further comprises a second electrode that overlies the first electrode on the substrate. On application of the actuation voltage, the movable element will bend, and the second electrode will be brought towards the first electrode on the substrate. In its second, ultimate position, the second electrode may be in contact with the first electrode.

It is a disadvantage of the known electronic device, that a separate layer is needed for the second electrode in the movable element. Since the layers of piezoelectric material must be cured at high temperatures of about 600 to 800° C., Pt is commonly used as an electrode material. However, this material has a relatively large internal resistance. Particularly for RF applications, such an internal resistance is undesired as it gives rise to loss and dissipation and possibly also to delay in switching. Probably for that reason, the known electronic device comprises a separate second electrode. However, the use of such a separate second electrode increases processing complexity.

It is therefore an object of the invention to provide an electronic device of the kind mentioned in the opening paragraph with a movable element that is provided with an actuator with reduced process complexity and that has at the same time still has an acceptable RF performance. This object is achieved in that the piezoelectric actuator comprises a piezoelectric layer that is on opposite surfaces provided with a second and a third electrode respectively. The second electrode of the actuator faces the substrate, while the third electrode constitutes an input electrode of the MEMS element, so that a current path through the MEMS element comprises the piezoelectric layer and the tunable gap.

In the device of the invention, the process complexity is reduced in that one of the electrodes of the actuator is simultaneously the second electrode through which contact may be made with the first electrode in the second position of the MEMS element. The RF performance is maintained in that the actuator is used as a capacitor that is part of the MEMS element. In effect, a capacitor is substituted for the internal resistance of an interconnect in the third electrode layer, that would be needed otherwise. The impedance of this capacitor is less detrimental for the RF performance, since the capacity of a piezoelectric actuator generally is relatively high. Not only is a substantial surface area needed to define the actuator, but also has a piezoelectric layer usually a relatively high dielectric constant.

In a first embodiment, the first and the second electrode are arranged such that the first electrode is in contact with the piezoelectric layer in the second, closed position of the movable element. The absence of the second electrode at the area of contact has the advantage that the contact resistance is reduced. Moreover, the first and the second electrode are then isolated from each other and can be put on different voltages if so desired.

In a modification hereof, a fourth electrode is present on the substrate surface, that contacts the second electrode, when the movable element is in its second, closed position. The MEMS element is such provided with two outputs that are connected to the input simultaneously. Particularly, these are two capacitors connected in parallel so as to increase the maximum capacitance of the MEMS element.

In a second embodiment, the first electrode contacts the second electrode in the second, closed position of the movable element. Herewith, the MEMS element is a switch. The first electrode may be embodied as a single plate, but alternatively as a plurality of pads that are spaced apart. This increases the chance to have a good contact with the at least slightly bended movable element.

Suitably, the third electrode is provided with a low impedance coupling to another element. Such a low impedance coupling may be any kind of interconnect as generally known. In a first embodiment, the third electrode extends laterally as the interconnect. Since this electrode is generally deposited after the piezoelectric layer, its choice is not restricted due to temperature constraints. Particularly, the third electrode and the interconnect are defined in a metal layer with sufficient thickness. A sufficient thickness is for instance twice the thickness of the second electrode, preferably at least 0.1 microns and more preferably in the order of 0.5 to 3.0 microns.

Advantageously, the interconnect is designed as any kind of a microstrip. Particularly preferred is the embodiment as a transmission line, wherein the second electrode acts as a ground plane. However, a stripline design is not excluded.

In a second embodiment, an interconnect is coupled to the third electrode at the side facing away from the piezoelectric layer. This interconnect may be another conductive layer. The conductive layer may be laminated to the third electrode or coupled thereto with a via. Alternatively, the interconnect may be an assembled interconnect, such as one or more bond wires.

Preferably, the actuator is free of any structural layer that may be used to define a bending direction of the piezoelectric layer. Instead, the bending direction is defined in that the third electrode has a larger thickness than the second electrode. This has the advantage that the construction of the movable element can be rather simple. Ideally, for the case that both electrodes comprise the same metal, and particularly Pt, the thickness of the second electrode is equal to the sum of twice the thickness of the first electrode and half the thickness of the piezoelectric layer. Practically, if the materials of both electrodes are the same, then the thickness ratio is between 4 and 10; if dissimilar materials are used their thicknesses should be adjusted so that the ratio of their bending resistances is equal to that of the two electrodes of the same material with a thickness ratio between 4 and 10.

Comparison with the prior art document GB-A 2,353,410 may explain this advantage. The movable element shown therein is a movable element with a separate structural layer, which is the cantilever beam or the membrane. Consequently, in view of the desired bending direction, the actuator is present on the lower side of the beam or the membrane. The bending of the actuator has then to be transferred to the beam or membrane in order to bring the movable element towards the substrate. This involves mechanical stresses and makes the interface between the membrane and the actuator vulnerable for mechanical failure, for instance in the form of cracks or delamination. Additionally, the choice of a material for the beam or membrane is inherently difficult as it must fulfill the requirement of a structural layer, which implies a certain rigidity, and also the requirement of a membrane, which implies a sufficient elasticity. Moreover, connections to the electrodes of the actuator are needed on the movable element. In this device of the invention, movable element can be a construction of basically three layers. The number of interfaces is thus limited and the complexity of the movable element reduced.

Another advantage of this embodiment is that it allows integration in existing processes for electrostatic MEMS. A suitable process is known from WO-A2004/54088 in particular FIG. 7, and comprises three metal layers: a first metal layer on the substrate, and a second and a third in the movable element. The third metal layer is herein of sufficient thickness, in the order of 0.5-3.0 microns, so as to provide mechanical stability and to allow the definition of inductors. The second layer is used for a more adequate definition of the MEMS element. It can be patterned independently and at a higher resolution than the third layer. Suitably, use is made of two inorganic layers as sacrificial layers, and the second and the third layers are connected with a vertical interconnect. Now, the construction with a thicker third electrode and without a separate structural layer is structurally similar to the electrostatic MEMS process. In fact, by inclusion of deposition and patterning steps of the piezoelectric layer on the second electrode, the process flow can be substantially unamended It is understood that particularly in the three-layer design, there is no need that the second or the third electrode is a plate-like structure that extends overall. Particularly for the case of a double-or multiple-clamped beam, the bending behavior of the piezoelectric layer is improved by structuring one or both of the electrodes, such that portions of the piezoelectric layer are driven differently. Suitably, the structured layer is structured into three portions: a middle portion opposite to the first electrode and two edge portions. Preferably, the layer of the third electrode is structured. More preferably, both metal layers are structured. This structuring is described in more detail in the non-prepublished application EP03104894.5 (PHNL031531).

The electronic device of this invention may be manufactured in different manners. In one embodiment, use is made of a sacrificial layer technique, wherein the gap between the first and the second electrode is created by etching one or more sacrificial layers. In another embodiment, use is made of an assembly technique such as disclosed in the prior art patent application GB-A 2,353,410. The MEMS element in the electronic device is suitably provided with a separate package construction. Preferably it is hermetically encapsulated so that the atmosphere in the package construction can be controlled.

In a preferred embodiment of the method of the invention, the piezoelectric layer is a perovskite material. Examples hereof are materials from the family of lead-titanate-zirconate (PZT), including $PbZrTiO_3$, $Pb(X_{0.33}Nb_{0.67})O_3$-$PbTiO_3$, with X=Mg, Zn, Ni, or other, $Pb(Y_{0.5}Nb_5)O_3$-$PbTiO_3$, with Y=Sc, Mn, In, Y, or other, which materials may be doped with a metal such as La, Mn, W, Fe, Sb, Sr and Ni. These materials are preferred in view of their good processability through sol-gel precursors with relatively moderate sintering temperatures of 800° C. or less, and their controllable microstructure, also if processed at large substrates of a diameter of 6'" or even more. Other perovskite materials that can be used include for instance $Sr_3TaGa_3Si_2O_{14}$; $K(Sr_{1-x}Ba_x)_2Nb_5O_{15}$, where $(0 \leq x \leq 1)$; $Na(Sr_{1-x}Ba_x)_2Nb_5O_{15}$, where $(0 \leq x \leq 1)$; $BaTiO_3$; $(K_{1-x}Na_x)NbO_3$, where $(0 \leq x \leq 1)$; $(Bi,Na,K,Pb,Ba)TiO_3$; $(Bi,Na)TiO_3$; $Bi_7Ti_4NbO_{21}$; $(K_{1-x}Na_x)NbO_3$-$(Bi,Na,K,Pb,Ba)TiO_3$, where $(0 \leq x \leq 1)$; $a(Bi_xNa_{1-x})TiO_3$-$b(KNbO_{3-c})$ ½$(Bi_2O_3$—$Sc_2O_3)$, where $(0 \leq x \leq 1)$ and $(a+b+c=1)$; $(Ba_aSr_bCa_c)Ti_xZr_{1-x}O_3$, where $(0 \leq x \leq 1)$ and $(a+b+c=1)$; $(Ba_aSr_bLa_c)Bi_4Ti_4O_{15}$, where $(a+b+c=1)$; $Bi_4Ti_3O_{12}$; $LiNbO_3$; $La_3Ga_{5.5}Nb0_5O_{14}$; $La_3Ga_5SiO_{14}$; $La_3Ga_{5.5}Ta_{0.5}O_{14}$; AlN; ZnO.

The MEMS element can be construed in different ways. The piezoelectric element, that effectively is a beam, may be embodied as a single clamped beam, as a double clamped beam and as a multiple clamped beam. In the case of a single clamped beam it appears beneficial to prestress the beam. This means that it is provided with a determined curvature at zero actuation voltage. By application of an actuation voltage the piezoelectric layer will show expansion in a direction substantially perpendicular to the orientation of the applied electric field. Hence, it will become less curved, and the capacitance between the first and second MEMS electrodes will increase, or electrical contact between the first and second electrodes will be established. Experiments have shown that this flattening can indeed be achieved.

Figure 2:
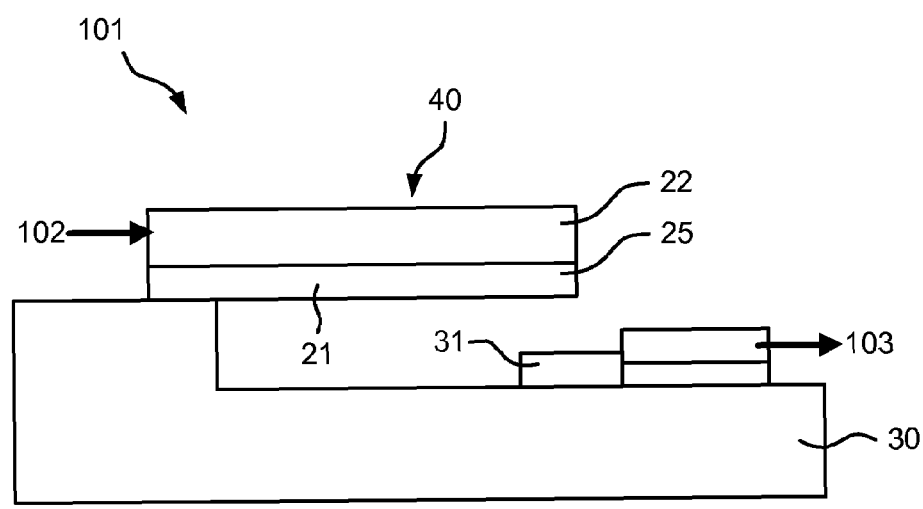

These and other aspects of the device of the invention will be further explained with reference to the Figures, in which:

FIG. 1 shows diagrammatically a cross-sectional view of a first embodiment of the device; and FIG. 2 shows diagrammatically a cross-sectional view of a second embodiment of the device.

FIG. 1 shows diagrammatically a cross-sectional view of a first embodiment of the device of the invention. The device is shown only so far as the MEMS element 101. It essentially comprises a movable element 40 and a substrate 30 that are mutually connected through a mechanical support 38. In this embodiment, the MEMS element 101 is made by assembly of the movable element 40 to the substrate 30.

The movable element 40 is used as the actuator and is provided with a piezoelectric layer 25, a second electrode 21 and a third electrode 22. It is supported mechanically through a support 38, that is present on the substrate 30. The MEMS element 101 further comprises a first electrode 31 on the substrate 30. Although not shown, there may be further electrodes in the movable element, such that the second electrode does not contribute substantially to the actuation. On application of a driving voltage to the actuator 40, e.g. between the second and the third electrode 21, 22, the movable element is movable towards and/or away from the first electrode 31. There are different options of moving the beam-shaped piezoelectric element. Generally, the movable element will be moved towards the first electrode 31 on application of a driving voltage, and will relax to its position away from the substrate 30 after removal of the driving voltage.

The MEMS element 101 as shown in FIG. 1 has the piezoelectric layer 25 as the carrying layer of the beam-shaped piezoelectric element. In this case, the piezoelectric layer 25 comprises lead lanthane zirconate titanate in the composition of $Pb_{1.02}La_{0.05}Zr_{0.53}Ti_{0.47}O_3$ and includes a first layer of lead zirconate titanate as a nucleation layer. A vertical interconnect 23 is present in the piezoelectric layer 25 so as to connect the third electrode 22. This interconnect 23 is made by wet-chemical etching, for instance with the method as described in U.S. Pat. No. 4,759,823. The third electrode 22 comprises Ti/Pt and the second electrode 21 comprises two sublayers of TiW and Al. The movable element 40 further comprises a structural layer 13, in this case of silicon nitride and a barrier layer 24, in this case of $TiO_2$. Bondpads 26 are defined in the layer of the second electrode 21, which bond pads 26 are covered by solderable metal, in this case layers 15, 16, 36, 35 of TiW/Au and Sn, each with a thickness in the order of 1 to 5 µm. Due to the connection of TiW/Al, TiW/Au, the bond pad structure has a good mechanical stability. Due to the use of TiW/Al the conductivity of the vertical interconnect 23 is excellent.

The substrate 30 is in this case a silicon substrate covered with a thermal oxide layer 32 and comprises active elements needed for driving the MEMS element 101 as well as any other active element, passive elements that may be integrated into filters and integrated circuits, as desired. As the skilled person will understand, the driving electronics for the MEMS element 101 could also be provided in the carrier layer if only partially removed. This is a matter of design and depends on the amount of functionality needed as well as the quality of the substrate material needed for the provision of driving electronics. The MEMS element 101 is made in that a carrier of the movable element (not shown) is at least partially removed. Particularly if it is removed over the complete surface area, it is preferable to remove the carrier only after the assembly. For the removal use can be made of techniques known per se. Particularly the structural layer 13 of silicon nitride also acts as an etch stop layer.

The embodiment shown in FIG. 1 is a capacitor. It has furthermore the feature that the second electrode 21 on the movable element 40 and the first electrode 31 on the substrate 30 are positioned such, that on perpendicular projection the one does not have an overlap with the other.

The capacitor operates in the following manner: on application of an actuation voltage the movable element 40 will bend towards the substrate 30. Then the piezoelectric layer 25 will come into contact with the first electrode 31. The resulting capacitor essentially consists then of the third electrode 22, the piezoelectric layer 25 and the first electrode 31.

The advantage of this capacitor is the good isolation in the situation in which the MEMS element 101 is opened, whereas the electric losses are nevertheless low. This is achieved in that the leakage current through the piezoelectric layer 25 is very limited and that the piezoelectric layer 25 has a high breakdown voltage, for instance in the range of 20 to 150 V. These beneficial properties result from the density and the non-porous structure of the piezoelectric layer 25, and furthermore from its thickness, preferably of more than 200 nm.

FIG. 2 shows an alternative realisation of the principle as shown in FIG. 1. The element 101 comprises a movable element 40 and is specifically provided with an RF input 102 and an RF output 103. The structure shown is provided with a 0.5 µm thick piezoelectric layer 25, in this case essentially consisting of $PbZr_{0.53}Ti_{0.47}O_3$, and having a relative dielectric constant of about 1000. The third electrode 22 is herein a layer of TiW/Al or Al with a thickness of 1 µm. The second electrode 21 is a layer of Pt of 0.3 µm. The element is a capacitive switch of which the capacity in the closed state is limited by the surface roughness of the contacts 21, 31, which typically is in the order of 5 nm or more. This negatively affects the capacitance density. By using a dielectric with a high dielectric constant, the resulting capacitor is nevertheless dense enough, as the average dielectric constant is still rather large.

The same construction can be used as a galvanic switch as well. The idea behind this switch is that the third electrode 22 will be used for transfer of the high-frequency signal, therewith reducing the resistive losses. The high-frequency signal must pass the dielectric, but this is in practice not a disadvantage in view of the high dielectric constant, the high frequency and the fact that the capacitor area is as large as the complete movable element 40.

The invention claimed is:

1. An electronic device being provided with a microelectromechanical system (MEMS) element that comprises:
   a first electrode that is present on a surface of a substrate;
   a movable element that overlies at least partially the first electrode and comprises a piezoelectric actuator, which movable element is movable towards and from the substrate by application of an actuation voltage between a first and a second position, in which first position it is separated from the substrate by a tunable gap,
   wherein the piezoelectric actuator comprises a piezoelectric layer that is on opposite surfaces provided with a second and a third electrode respectively, said second electrode facing the substrate and said third electrode forming an input electrode of the MEMS element, so that a current path through the MEMS element comprises the piezoelectric layer and the tunable gap.

2. An electronic device as claimed in claim 1, wherein the first and the second electrode are arranged such that the first electrode is in contact with the piezoelectric in the second, closed position of the movable element.

3. An electronic device as claimed in claim 1, wherein the first electrode contacts the second electrode in the second, closed position of the movable element.

4. An electronic device as claimed in claim 1, wherein the movable element is free of any additional structural layer, and at least one of the piezoelectric layer and the layer of the third electrode constitute a carrier layer of the movable element.

5. An electronic device as claimed in claim 1, wherein the third electrode extends laterally as art interconnect to another element in the device.

6. An electronic device as claimed in claim 5, wherein the second electrode is connected to ground, such that the third electrode functions as a transmission line.

7. An electronic device as claimed in claim 1, wherein the second electrode has a thickness that is at most half of the thickness of the third electrode.

8. An electronic device as claimed in claim 7, wherein the thickness of the second electrode is at most a fifth of the thickness of the third electrode.

9. An electronic device as claimed in claim 1, wherein at least one of the layers of the second and the third electrode is structured, such that portions of the piezoelectric layer can be provided with different driving voltages.

* * * * *